United States Patent
Gobrecht et al.

[11] Patent Number: 5,221,851
[45] Date of Patent: Jun. 22, 1993

[54] CONTROLLED-TURN-OFF HIGH-POWER SEMICONDUCTOR COMPONENT

[75] Inventors: Jens Gobrecht, Gebenstorf; Thomas Stockmeier, Würenlingen, both of Switzerland

[73] Assignee: Asea Brown Boveri Ltd., Baden, Switzerland

[21] Appl. No.: 830,921

[22] Filed: Feb. 4, 1992

[30] Foreign Application Priority Data

Feb. 22, 1991 [CH] Switzerland ............... 538/91

[51] Int. Cl.[5] ............... H01L 29/74; H01L 23/02; H01L 23/16
[52] U.S. Cl. ............... 257/177; 257/146; 257/150; 257/181; 257/409; 257/693; 257/698; 257/700; 257/724; 257/726; 257/729; 257/730
[58] Field of Search ............... 357/38, 75, 74, 23.8, 357/45, 65; 257/146, 150, 177, 181, 409, 693, 698, 700, 724, 726, 729, 730

[56] References Cited

U.S. PATENT DOCUMENTS

| | | | |
|---|---|---|---|
| 4,313,128 | 1/1982 | Schiegel | 357/79 |
| 4,596,999 | 6/1986 | Gobrecht et al. | 357/22 |
| 4,801,554 | 1/1989 | Gobrecht et al. | 437/6 |
| 4,829,348 | 5/1989 | Broich et al. | 357/22 |
| 4,849,800 | 7/1989 | Abbas et al. | 357/38 |
| 5,006,921 | 4/1991 | Ishizuka et al. | 357/75 |

FOREIGN PATENT DOCUMENTS

| | | |
|---|---|---|
| 0064231 | 11/1982 | European Pat. Off. |
| 0064383 | 11/1982 | European Pat. Off. |
| 0265833 | 5/1988 | European Pat. Off. |
| 0347613 | 12/1989 | European Pat. Off. |
| 2135824 | 9/1984 | United Kingdom |

Primary Examiner—Andrew J. James
Attorney, Agent, or Firm—Oblon, Spivak, McClelland, Maier & Neustadt

[57] ABSTRACT

In a large-area controlled-turn-off high-power semiconductor component containing a multiplicity of finely structured individual components, a semiconductor device (12) is formed by a multiplicity of small-area semiconductor chips (7) which are accommodated alongside one another in a common housing (13) and connected in parallel. This achievement avoids problems of yield with structures which are becoming finer.

16 Claims, 3 Drawing Sheets

CONTROLLED-TURN-OFF HIGH-POWER SEMICONDUCTOR COMPONENT

BACKGROUND OF THE INVENTION

1. Field of the Invention

The present invention relates to the field of power electronics. It relates in particular to a controlled-turn-off high-power semiconductor component for a maximum turn-off current of more than 100 A, comprising
   (a) a semiconductor device having an active semiconductor area which is substantially greater than 1 cm$^2$;
   (b) a fine structure composed of a multiplicity of parallel-connected individual elements inside the semiconductor device;
   (c) the individual elements being combined in groups.

Such a component is known, for example, from the publication EP-A3-0 064 231 in the form of a transistor or gate-turn-off thyristor (GTO).

2. Discussion of Background

Because of the continuously increasing requirements imposed by circuit engineers, future power semiconductor components will also be finely structured in the high-power range, i.e. will have structures in the $\mu m$ range. In this connection, both purely bipolar and mixed bipolar and MOS technologies (BiMOS) are suitable for the implementation. An example of the medium power range, where these structures are already established, is the IGBT (Insulated Gate Bipolar Transistor).

On the one hand it is now generally known that, as current loading increases, the active areas and, consequently, the chip size of such components also increase. Thus, in the high-power range, currents (from a few 100 A up to a few 1000 A) are controlled or switched, and these can only be handled with chip areas which are substantially greater than 1 cm$^2$.

On the other hand, unavoidable defects which limit the so-called chip yield occur in the production of semiconductor components. In this connection, the density of these defects is essentially determined by the available clean-room class and the number of process steps. Naturally, the yield decreases with increasing chip area and also with increasing miniaturization of component structures. In practice, it is currently assumed that finely structured components having chip areas which are substantially greater than 1 cm$^2$ cannot be manufactured economically. This also manifests itself, for example, in the chip prices: 5 MOSFETs each carrying 10 A taken together are cheaper than 1 chip carrying 50 A.

So-called "repair techniques" which are intended to enable the defects to be eliminated or to be passivated and acceptable yields consequently to be achieved, nevertheless, on large areas are therefore being intensively investigated for the high-power components mentioned. Thus, in a large-area semiconductor component (GTO or power transistor) which comprises several 1000 individual elements, the publication mentioned in the introduction proposes to combine the individual elements in groups (for example, of 100 each) and to make common contact for each group. In this way, defective individual elements can be more easily detected inside a group and rendered harmless.

Such repair concepts have, however, the following disadvantages:

The decommissioning of particular individual elements or of entire subareas results in an inhomogeneous current distribution over the component area, which may possibly impair the electrical operation, in particular the turn-off power in the case of thyristors; and the repair itself (including the identification of the defective individual elements) requires a substantial metrological and time expenditure.

SUMMARY OF THE INVENTION

The object of the invention is therefore to provide a high-power semiconductor component which, while simple to produce, can be manufactured with high yield and manages without repair techniques.

In a component of the type mentioned in the introduction, the object is achieved by (a) a semiconductor device (12) having an active semiconductor area which is substantially greater than 1 cm$^2$;

(b) a fine structure composed of a multiplicity of parallel-connected individual elements inside the semiconductor device (12);

(c) the individual elements being combined in groups; wherein (d) the semiconductor device is composed of a multiplicity of individual, similar and parallel-connected semiconductor chips;

(e) the individual semiconductor chips have an active area which is less than or approximately equal to 1 cm$^2$ and each comprises a group of individual elements; and (f) the semiconductor chips are accommodated on a common substrate in a common housing.

The essence of the invention is therefore to combine a multiplicity of small-area chips in one component, replacing a single chip having a large area. The small-area chips (area less than 1 cm$^2$) can at the same time be produced with an acceptable yield, be tested individually (Autoprober) and be integrated in mosaic and hybrid fashion to form a single high-power component while being capable of operation.

In this connection it is assumed that the finely structured components in question can simply be connected in parallel. For some of these components, such as power MOSFETs, FCThs and IGBTs, the correctness of this assumption has already been confirmed in practice.

The actual size of the area of the chips is calculated from the optimum between the defect density applicable to the particular manufacture and the semiconductor area additionally necessary for the edge termination (depending on the blocking voltage). Under the currently standard conditions, this value is probably between 0.2 and 1 cm$^2$, and with very good clean-room class, perhaps even somewhat higher.

In addition to the advantages already cited, the achievement according to the invention has further substantial advantages:

In the context of a modular construction, the entire current range can be covered by a single design (1 set of masks);

the reverse-conducting components which can be used advantageously for most converters can be produced in a particularly simple manner by suitably combining thyristor chips and diode chips, especially as the diode and thyristor elements can be optimized independently of one another;

in contrast to large-area components, the individual chips, whose area is less than 1 cm$^2$, can advantageously be produced by the stepper technology which is now standard for ICs; and the individual chips can be mounted using the proven "die-bond" or soldering technology and this process can be very easily automated.

The invention yields particular advantages if the maximum turn-off current of the component is greater than 1000 A and its active area is greater than 10 cm$^2$.

A first preferred embodiment of the component according to the invention is one wherein the common housing comprises an insulating housing and a disk-type cathode contact and a disk-type anode contact, the cathode contact and the anode contact each being joined to the insulating housing by means of flanges and sealing the housing on both sides.

A further preferred embodiment is one wherein (a) the semiconductor chips are deposited on a conducting substrate as the common base;

(b) the semiconductor chips are surrounded by a common gate plate which is of insulated construction and is parallel to the substrate, which gate plate carries the leads for controlling the semiconductor chips;

(c) the cathode contact is provided on its inner side with contact posts for each of the semiconductor chips; and (d) the contact posts press on the semiconductor chips through passage holes in the gate plate and make contact to the former.

In this way, the "hockey-puck" or "press-pack" housings which are standard in power electronics can be adopted.

Further embodiments emerge from the subordinate claims.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
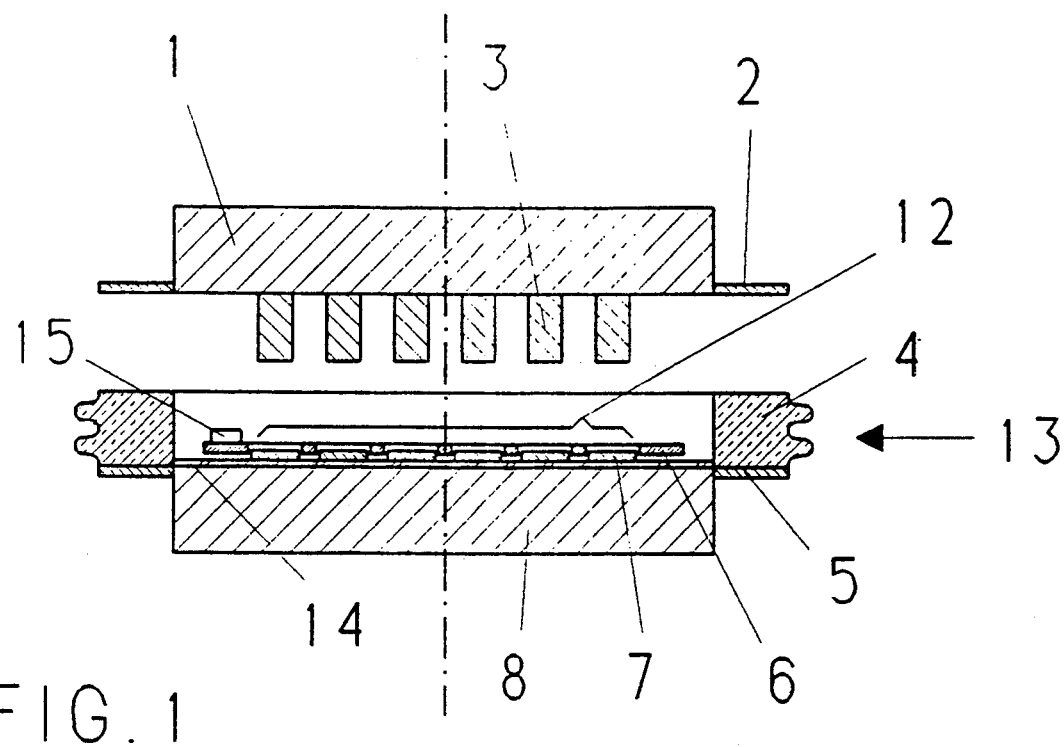
FIG. 1 shows a preferred embodiment of a component according to the invention in cross section.

Referring now to the drawings, wherein like reference numerals designate identical or corresponding parts throughout the several views, FIG. 1 shows, in cross section, a preferred embodiment of a high-power semiconductor component according to the invention in overall view. The central constituent of this component is a semiconductor device 12 having a multiplicity of individual semiconductor chips 7 which are arranged separately alongside one another and which are accommodated in a common housing 13 and are connected electrically in parallel. The total active semiconductor area needed for high currents is made up in this way from a multiplicity of individual areas.

The housing 13 preferably has a structure known from the prior art (metal-ceramic or metal-plastic housing in "hockey-puck" form). It comprises, firstly, an annular (or square or rectangular or otherwise sealed; insulating housing 4 made of ceramic or plastic which may be on the outside in a manner known per se of rib-like construction, for example, as shown in FIG. 1, for high blocking voltages. The insulating housing 4 is sealed on the upper side by a solid disk-type cathode contact 1 and on the lower side by a corresponding anode contact 8, the materially unbroken joint being made by means of suitable flanges 2 and 5 (in FIG. 1, the cathode contact 1 is shown in the disassembled state for the purpose of improved clarity). Cathode contact 1 and anode contact 8 are made from an electrically and thermally highly conducting material, for example Cu.

Contact is made to the semiconductor chips 7 on both sides (on the upper and lower side). For this purpose, they are soldered or bonded onto a disk-type conducting substrate 14 whose thermal expansion is matched to the semiconductor material and which is composed, for example, of Mo, Cu or of a Mo-Cu compound. The substrate 14 lies on the anode contact 8 and is pressed against it. For this purpose, individual contact posts 3, which press on the semiconductor chips 7 after assembly and at the same time make contact to them on their upper side, are arranged on the oppositely situated inner side of the cathode contact 1, directly above each of the semiconductor chips 7. The contact posts 3 may be composed of the same material as the cathode contact 1 and may be formed for example out of the solid material of the cathode contact 1 by making suitable grooves or slots. In an analogous but pressure-free type of housing, the contact posts 3 may, however, also be soldered onto the surfaces of the semiconductor chips 7.

As a result of the common substrate 14 and the contact posts 3 provided directly at the cathode contact 1, the semiconductor chips 7 are in their totality connected electrically in parallel and are coupled electrically and thermally to the housing 13. Under these circumstances, the current to be controlled flows via the cathode contact 1 and the anode contact 8.

Figure 2:
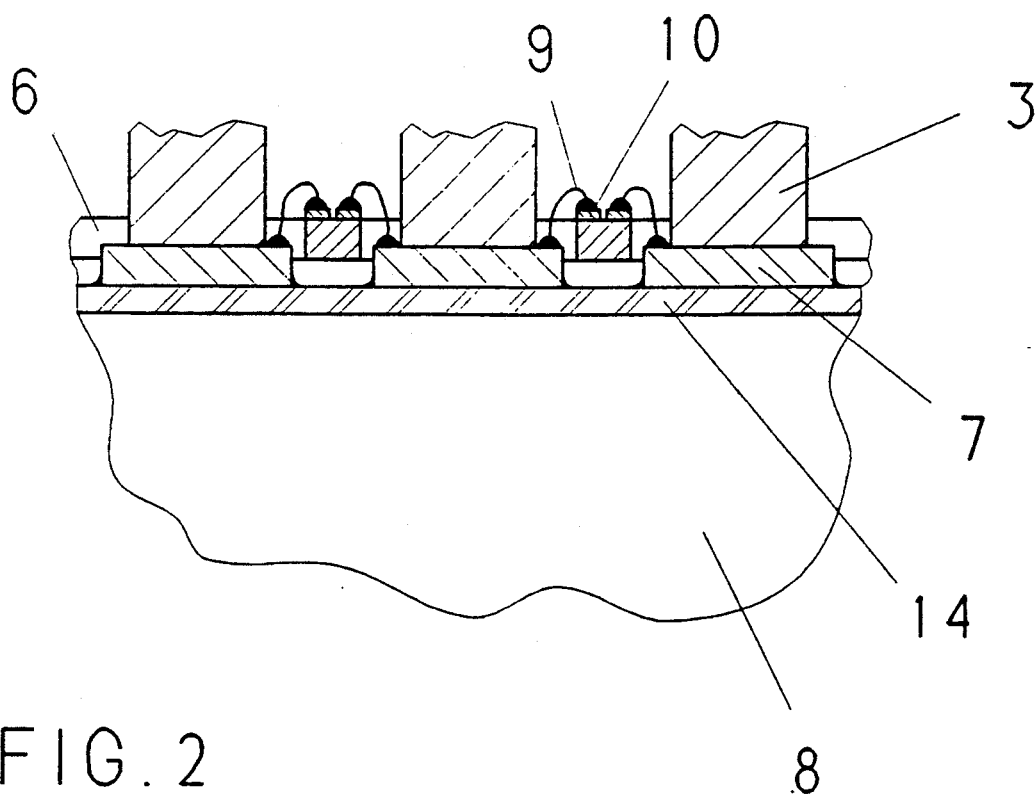
FIG. 2 shows the arrangement and connection of individual semiconductor chips in a component according to FIG. 1 in an enlarged detail.

A separate disk-type gate plate 6 which is arranged parallel to, and slightly above the substrate 14 and surrounds the semiconductor chips 7 is provided for triggering the individual semiconductor chips 7. For this purpose the gate plate 6 has a multiplicity of passage holes 11 (FIG. 3) which correspond in arrangement and number to the semiconductor chips 7 and leave room for the contact posts 3. The gate plate 6 is, for example, a printed circuit board with conductor tracks 10 (FIG. 2) which conduct the trigger signals for the semiconductor chips 7 and are connected to the gate terminals of the individual semiconductor chips 7 by bonding wires 9. The component gate does not, however, necessarily have to be connected, as shown in FIG. 2, by bonding each individual semiconductor chip 7, but the gate plate 6 may also have small contact tongues which in turn press on matching bumps on the semiconductor chips 7. Such mounting techniques are known, for example, from IC technology.

Figure 3:
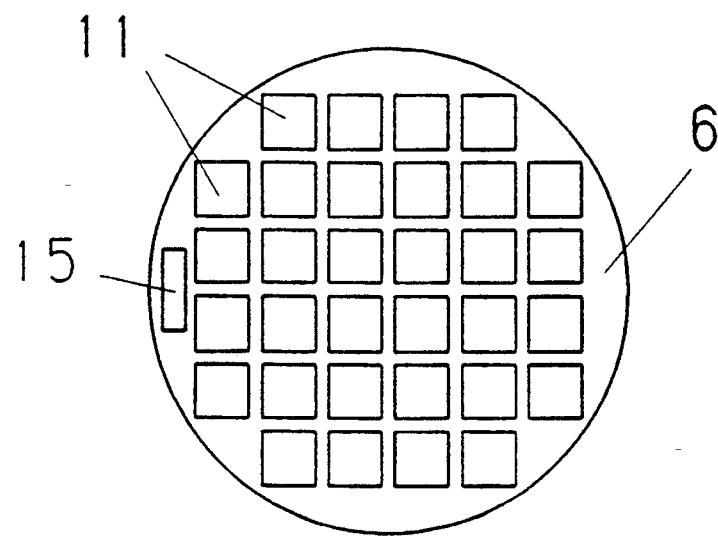
FIG. 3 shows a possible design of the gate plate from FIGS. 1 and 2 in plan view.

In addition, the gate plate 6 advantageously may carry on its free areas one or more components 15 (for example, driver transistors and/or passive components)

which serve to trigger or to protect the individual semiconductor chips 7 (FIGS. 1 and 3).

The nature and internal structure of the semiconductor chips 7 themselves has not been dealt with in greater detail in the explanations hitherto. If the component as a whole is an MCT, IGBT, GTO or MOSFET, the internal structure of all the semiconductor chips 7 is correspondingly the structure of an MCT, IGBT, GTO or MOSFET.

The situation is different if, for example, the component is to fulfill the function of a reverse-conducting thyristor. In this case, the semiconductor chip 7 population is subdivided into two subpopulations (FIG. 4); one of the two subpopulations comprises thyristor chips 7a having an internal thyristor structure, and the other of the two subpopulations comprises diode chips 7b having an internal diode structure. Inside the semiconductor device 12, the thyristor chips 7a and the diode chips 7b are then alternately arranged alongside one another (as shown in FIG. 4) and connected antiparallel to one another, with the result that, as a whole, they form a reverse-conducting thyristor.

Figure 4:
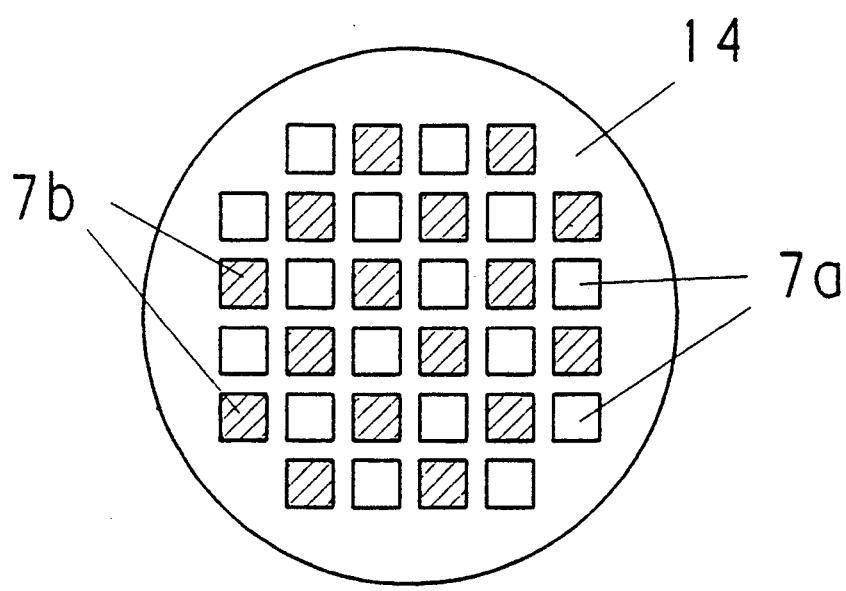
FIG. 4 shows the arrangement of thyristor and semiconductor chips on the substrate for the embodiment of a reverse-conducting thyristor according to FIGS. 1 and 2 in plan view.

As an example, reference may be made for this purpose to a reverse-conducting MOS-controlled thyristor (MCT) with a maximum turn-off current of 2000 A; with an assumed optimum size of the semiconductor chips 7 of 0.5 cm$^2$ (equivalent to a turn-off current of about 50 A), 40 thyristor chips 7a of the MCT type and, for example, 20 equally large diode chips 7b are needed for this component and are combined with one another in the manner shown in FIG. 4.

Figure 5:
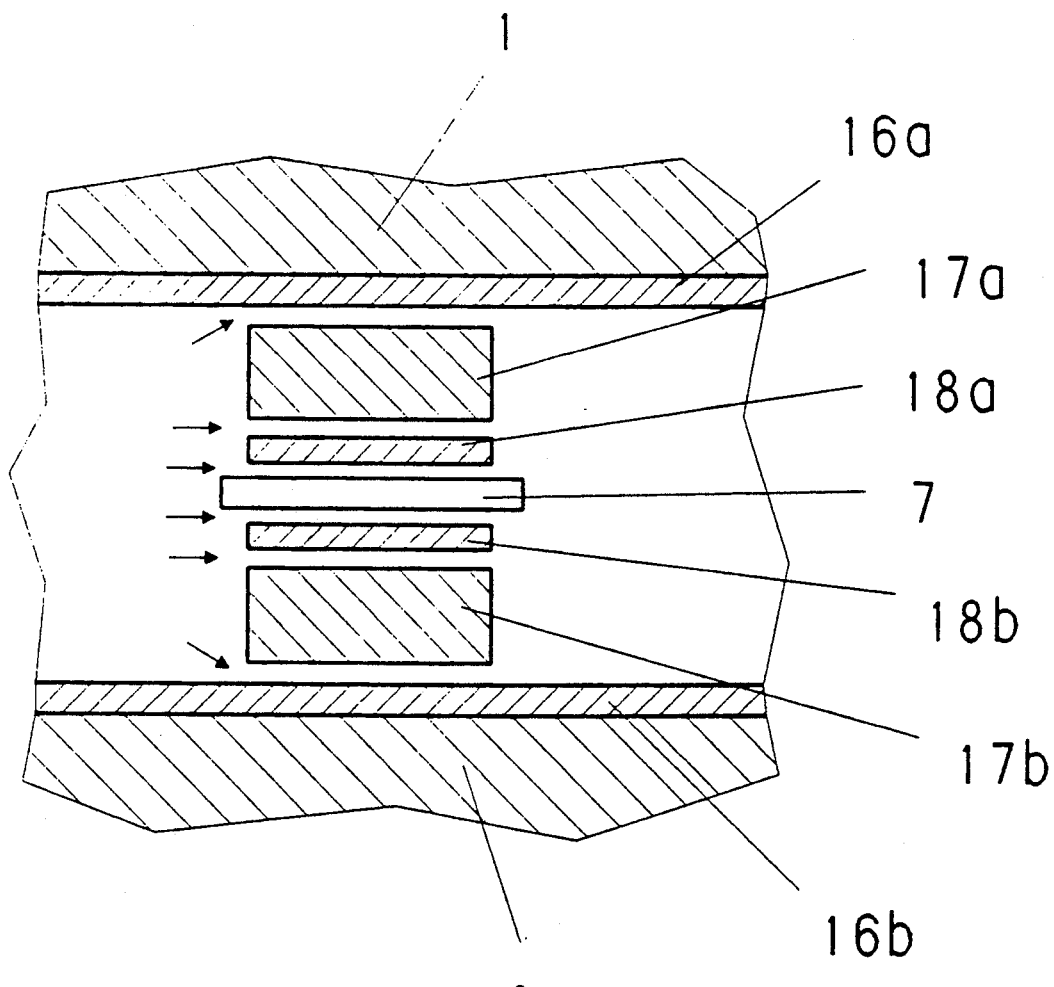
FIG. 5 shows a further preferred embodiment of a component according to the invention having sandwich construction for the individual semiconductor chip and cathode-side and anode-side contact posts.

It may be pointed out at this juncture that contact posts for making contact to the semiconductor chips 7 may be provided not only on the cathode side (as shown in FIGS. 1 and 2), but also on the anode side (in this connection see, for example, also FIG. 5). This is important, in particular, in the reverse-conducting component just described since in the case of the antiparallel diodes, the high voltage is applied to the anode side and for this reason there must be a sufficiently large distance from the base to avoid flashovers.

Finally, FIG. 5 shows a detail of a further preferred embodiment of a component according to the invention in an exploded representation. In this case, the individual semiconductor chips 7 are assembled with upper and lower Mo disks 18a and 18b, respectively, and upper and lower contact posts 17a and 17b (made, for example, of Cu), respectively by soldering to form a sandwich-type structure. The individual sandwiches are then soldered between an upper and a lower Mo plate 16a and 16b, respectively, which are finally inserted into the housing. In this connection, the arrows in FIG. 5 indicate the position of the solder interlayers which are necessary to hold the structure together. Once again a gate plate, which is not shown in FIG. 5 for the sake of clarity, may also be provided for the gate connection in this case.

In principle, other constructional developments are also conceivable within the scope of the invention in addition to those shown here. In this connection, it is especially important that a high-power semiconductor component is constructed using an assembly of smaller power components in a housing meeting the current standards.

In conclusion, it can be stated that high-power semiconductor components of the next generation—regardless of what type of silicon structure is involved in detail—can be produced very economically using the achievement according to the invention.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A controlled-turn-off high-power semiconductor component for a maximum turn-off current of more than 100 A, comprising
    (a) a semiconductor device (12) having an active semiconductor area which is substantially greater than 1 cm$^2$;
    (b) a fine structure composed of a multiplicity of parallel-connected individual elements inside the semiconductor device (12);
    (c) the individual elements being combined in groups; wherein
    (d) the semiconductor device (12) is composed of a multiplicity of individual, similar and parallel-connected semiconductor chips (7);
    (e) the individual semiconductor chips (7) have an active area which is less than or approximately equal to 1 cm$^2$ and each comprise a group of individual elements;
    (f) the semiconductor chips (7) are accommodated on a common substrate in a common housing (13);
    (g) the semiconductor chip (7) population is subdivided into two subpopulations;
    (h) one of the two subpopulations comprises thyristor chips (7a) having an internal thyristor structure, and the other of the two subpopulations comprises diode chips (7b) having an internal diode structure; and
    (i) inside the semiconductor device (12) the thyristor chips (7a) and the diode chips (7b) are alternately arranged alongside one another and connected antiparallel to one another, and form a reverse-conducting thyristor.

2. The component as claimed in claim 1, wherein
    (a) the maximum turn-off current is greater than 1000 A; and
    (b) the active area is greater than 10 cm$^2$.

3. The component as claimed in claim 1, wherein at least some of the semiconductor chips (7) have an internal structure of a component from the group comprising the MCTs, IGBTs, GTOs and MOSFETs.

4. The component as claimed in claim 1, wherein the common housing (13) comprises an insulating housing (4) and a disk-type cathode contact (1) and a disk-type anode contact (8), the cathode contact (1) and the anode contact (8) each being joined to the insulating housing (4) by means of flanges (2, 5) and sealing the housing (13) on both sides.

5. The component as claimed in claim 4, wherein
    (a) the semiconductor chips (7) are deposited on a conducting substrate (14) as the common base;
    (b) the semiconductor chips (7) are surrounded by a common gate plate (6) which is of insulated construction and is parallel to the substrate (14), which gate plate (6) carries the leads for controlling the semiconductor chips (7);
    (c) the cathode contact (1) is provided on its inner side with contact posts (3) for each of the semiconductor chips (7); and (d) the contact posts (3) press on the semiconductor chips (7) through passage holes (11) in the gate plate (6) and make contact to with the semiconductor chips.

6. The component as claimed in claim 5, wherein
   (a) the substrate (14) is a disk made of one of the metals Mo, Cu or of a Cu-Mo compound;
   (b) The semiconductor chips (7) are soldered or bonded onto the substrate (14); and
   (c) The gate plate (6) is constructed as a circuit board to which the semiconductor chips (7) are connected by bonding wires (9).

7. The component as claimed in claim 6, wherein the gate plate (6) additionally carries at least one component (15) which is provided to trigger or to protect the semiconductor chips (7).

8. The component as claimed in claim 4, wherein
   (a) the cathode contact (1) is provided on its inner side with a plurality of upper contact posts (17a);
   (b) the anode contact (8) is provided on its inner side with a plurality of lower contact posts (17b); and
   (c) every semiconductor chip (7) is arranged between an upper and a lower contact post (17a and 17b respectively).

9. A controlled-turn-off high-power semiconductor component for a maximum turn-off current of more than 100 A, comprising
   (a) a semiconductor device (12) having an active semiconductor area which is substantially greater than 1 cm$^2$;
   (b) a fine structure composed of a multiplicity of parallel-connected individual elements inside the semiconductor device (12);
   (c) the semiconductor device (12) being composed of a multiplicity of individual, similar and parallel-connected semiconductor chips (7), and the individual semiconductor chips (7) having an active area which is less than or approximately equal to 1 cm$^2$ and each comprising a group of individual elements;
   (d) the semiconductor chips (7) being accommodated on a common substrate in a common housing (13), and the common housing (13) comprising an insulating housing (4) and a disk-type cathode contact (1) and a disk-type anode contact (8); and
   (e) the cathode contact (1) and the anode contact (8) each being joined to the insulating housing (4) by means of flanges (2, 5) and sealing the housing (13) on both sides;
   wherein
   (f) the semiconductor chips (7) are deposited on a conducting substrate (14) as the common base;
   (g) the semiconductor chips (7) are surrounded by a common gate plate (6) which is of insulated construction and is parallel to the substrate (14) as the common base;
   (g) the semiconductor chips (7) are surrounded by a common gate plate (6) which is of insulated construction and is parallel to the substrate (14), which gate plate (6) carries the leads for controlling the semiconductor chips (7);
   (h) the cathode contact (1) is provided on its inner side with contact posts (3) for each of the semiconductor chips (7); and
   (i) the contact posts (3) press on the semiconductor chips (7) through passage holes (11) in the gate plate (6) and make contact to the semiconductor chips (7).

10. The component as claimed in claim 9, wherein
    (a) the substrate (14) is a disk made of one of the metals Mo, Cu or of a Cu-Mo compound;
    (b) the semiconductor chips (7) are soldered or bonded onto the substrate (14); and
    (c) the gate plate (6) is constructed as a circuit board to which the semiconductor chips (7) are connected by bonding wires (9).

11. The component as claimed in claim 10, wherein the gate plate (6) additionally carries at least one component (15) which is provided to trigger or to protect the semiconductor chips (7).

12. The component as claimed in claim 9, wherein
    (a) the semiconductor chip (7) population is subdivided into two subpopulations;
    (b) one of the two subpopulations comprises thyristor chips (7a) having an internal thyristor structure, and the other of the two subpopulations comprises diode chips (7b) having an internal diode structure; and
    (c) inside the semiconductor device (12) the thyristor chips (7a) and the diode chips (7b) are alternately arranged alongside one another and connected antiparallel to one another, and form a reverse-conducting thyristor.

13. A controlled-turn-off high-power semiconductor area greater than 1 cm$^2$;
    the semiconductor device being composed of a multiplicity of individual, similar and parallel-connected semiconductor chips, each of the individual semiconductor chips having an active area which is less than or approximately equal to 1 cm$^2$ and each individual semiconductor chip comprising a group of individual elements;
    the semiconductor chips being accommodated on a common substrate in a common housing, and the common housing comprising an insulating housing, a disk-type cathode contact and a disk-type anode contact;
    the cathode contact and the anode contact each being joined to the insulating housing by means of flanges which seal the housing on both sides;
    each of the semiconductor chips being deposited on a conducting substrate as a common base;
    the semiconductor chips being surrounded by a common gate plate which is of an insulated construction and is parallel to the conducting substrate, wherein the gate plate carries leads for controlling the semiconductor chips;
    the cathode contact being provided on its inner side with contact posts for each of the semiconductor chips; and
    the contact posts pressing on the semiconductor chips through passage holes in the gate plate to make contact with the semiconductor chips.

14. The semiconductor component according to claim 13, wherein:
    the substrate is a disk made of one of the metals Mo, Cu or of a Cu-Mo compound;
    the semiconductor chips are soldered or bonded onto the substrate; and
    the gate plate is constructed as a circuit board to which the semiconductor chips are connected by bonding wires.

15. The semiconductor component according to claim 14, wherein the gate plate further carries at least one component which is provided to trigger or to protect the semiconductor chips.

16. The semiconductor component according to claim 13, wherein:
the semiconductor chips are subdivided into two subpopulations;
wherein a first of the two subpopulations comprises thyristor chips having an internal thyristor structure, and a second of the two subpopulations comprises diode chips having an internal diode structure; and
wherein inside the semiconductor device the thyristor chips and the diode chips are alternately arranged alongside one another and connected antiparallel to one another to form a reverse-conducting thyristor.

* * * * *